United States Patent [19]

Sokoloski

[11] 4,042,946
[45] Aug. 16, 1977

[54] RADIATION HARDENED FIELD EFFECT DEVICE

[75] Inventor: Martin M. Sokoloski, Columbia, Md.

[73] Assignee: The United States of America as represented by the Secretary of the Army, Washington, D.C.

[21] Appl. No.: 748,586

[22] Filed: Dec. 8, 1976

[51] Int. Cl.² .................. H01L 29/78; H01L 29/66; H01L 23/36; G01T 1/24

[52] U.S. Cl. ........................ 357/25; 357/23; 357/29; 357/28; 357/78

[58] Field of Search ............... 357/23, 25, 28, 29, 357/78

[56] References Cited
PUBLICATIONS

Review of Scientific Instruments – vol. 47, No. 6, pp. 738-740, June 1976, Lundstrom et al.

Primary Examiner—Edward J. Wojciechowicz
Attorney, Agent, or Firm—Nathan Edelberg; Robert P. Gibson; Saul Elbaum

[57] ABSTRACT

A semiconductor device which utilizes metallic electrodes whose work function can be altered so as to render the device insensitive to the harmful effects caused by exposure to a hostile radiation environment or other events which deleteriously influence the threshold voltage. The gate electrodes of the device consist of materials whose work function is changed by either desorbing or absorbing hydrogen. Depending upon whether the hydride has a larger or smaller work function than the unhydrated material, the invention desorbs or absorbs hydrogen in response to a signal from a sensing circuit which is activated by changes in the threshold voltage of the device.

10 Claims, 5 Drawing Figures

RADIATION HARDENED FIELD EFFECT DEVICE

RIGHTS OF THE GOVERNMENT

This invention described herein maybe manufactured, used, and licensed by or for the United States Government for governmental purposes without the payment to me of any royalty thereon.

BACKGROUND OF THE INVENTION

This invention is in the field of semiconductor devices insensitive to hostile radiation and more specifically is related to field effect devices whose gate electrodes consist of materials whose work function can be changed.

The MOSFET (metal-oxide-semiconductor-field-effect-transistor) device is a generic name for a broad class of solid state devices such as PMOS, NMOS and CMOS. The operation of MOSFETs and similar devices such as insulated gate transistors depends upon the creation of an inversion charge layer between the "source" and "drain" electrodes by application of a voltage to the "gate" electrode. Upon application of this voltage, conduction between source and drain commences. This voltage is called the threshold voltage and is given theoretically by the equation:

$$V_T = \phi - (\sigma/\epsilon) d - F.$$

Where $\phi$ is the work function of the metal electrode, $\sigma$ is the total charge at the oxide-semiconductor interface, $\epsilon$ is the oxide dielectric constant, d is the oxide thickness, and F a term which is relatively constant. If the conduction carriers between source and drain are electrons (holes), the MOSFET is called an N-channel (P-channel) device. For an N-channel and P-channel device the threshold voltages, relative to each other, are positive and negative, respectively. However, if somehow, positive interface charge, $\sigma$, were added then $V_T$ would decrease for both N- and P-MOS devices. For the former the device would be easier to "turn-on", whereas for the latter the opposite would be true. The situation can occur where there is enough $\sigma$ to make an N-channel device turn on at $V_T =$ O. This is, indeed, what happens to these devices in a hostile radiation environment. The radiation causes plasmons to be excited in the oxide. These, in turn, decay into electron-hole pairs; the holes under the appropriate gate voltage are transported to the oxide-semiconductor interface and subsequently trapped by presently unknown means. The end result is an increase in $\sigma$, decrease in $V_T$, and a vital change in circuit parameters which can be catastropic for a sensitive electronic package. Additionally, although some annealing occurs with time and elevated temperature, the increase in $\sigma$ is for many practical applications irreversible.

Various techniques have been utilized to render similar devices immune to unfriendly radiation. M.J. Rand and P.F. Schmidt disclose in U.S. Pat. No. 3,795,935 a silicon oxynitride dielectric coating which prevents both the formation of space charge in the dielectric and the formation of interface states. Although providing a high degree of insensitivity, it does not render the device totally immune to radiation effects. U.S. Pat. No. 3,882,530 to Danchenko discloses radiation hardening of a MOSFET device by introducing boron into the oxide insulating layer of the device. The technique disclosed utilizes a self-recovery mechanism for which a period of time must lapse before it returns to its pre-radiation electrical state.

The present invention utilizes the properties exhibited by the transition metals and alloys thereof of absorbing hydrogen interstitially. This absorption in these materials is reversible. See K.I. Lundstrom, M.S. Shivaraman, and C.M. Svenson, *J. Appl. Phys,* 46,3876 (1975). One change exhibited in this process is in the metal's work function. What this inventor has discovered is that by utilizing this property with appropriate circuitry and means for controlling the amount of hydrogen present in the electrode the device can be rendered insensitive to radiation environments. Additionally, the device can be made responsive to other influences affecting the gate electrode capacitance — voltage characteristics.

It is therefore one object of this invention to provide a solid state device which is insensitive to the effects of a harmful radiation environment.

Another object of this invention is to provide a device which retains its vital electrical parameters rapidly upon subjection to a hostile radiation environment.

A further object of this invention is to provide a solid state device whose vital parameters are unaffected by it being made a radiation hardened device.

Still another object of this invention is to provide a gate field effect transistor, utilizing special electrodes and their related hydrogen properties, so its work function can be altered to compensate for changes in the threshold voltage of the device.

SUMMARY OF THE INVENTION

The foregoing and other objects are attained in accordance with one aspect of the present invention through the provision of a field effect device whose gate electrodes consist of materials, i.e., transistion metals and their alloys, which have the property of absorbing hydrogen so that the metal's or metal hydride's work function can be changed. Along with appropriate circuitry this property of hydrogen can be used to cancel the degrading effects which are the result of hole trapping at the oxide semiconductor interface due to radiation.

BRIEF DESCRIPTION OF THE DRAWINGS

The invention and its other objects and features will be more clearly understood from the following detailed description taken in conjunction with the drawings in which.

DESCRIPTION OF THE PREFERRED EMBODIMENTS

Figure 1:
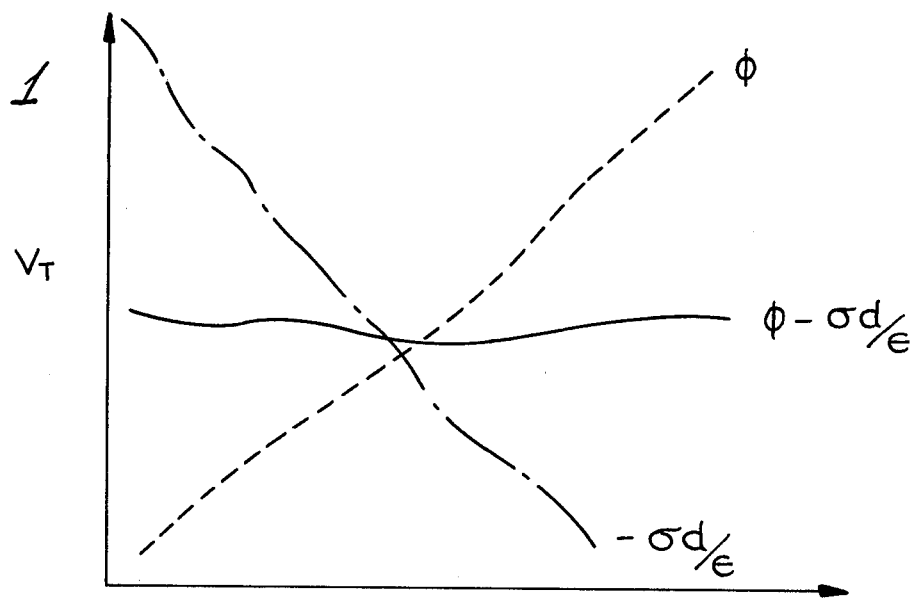
FIG. 1 illustrates graphically the change in threshold voltage due to an increase in trapped oxid charge, $\sigma$, and the effect of an increasing metal gate electrode work function.
Figure 2:
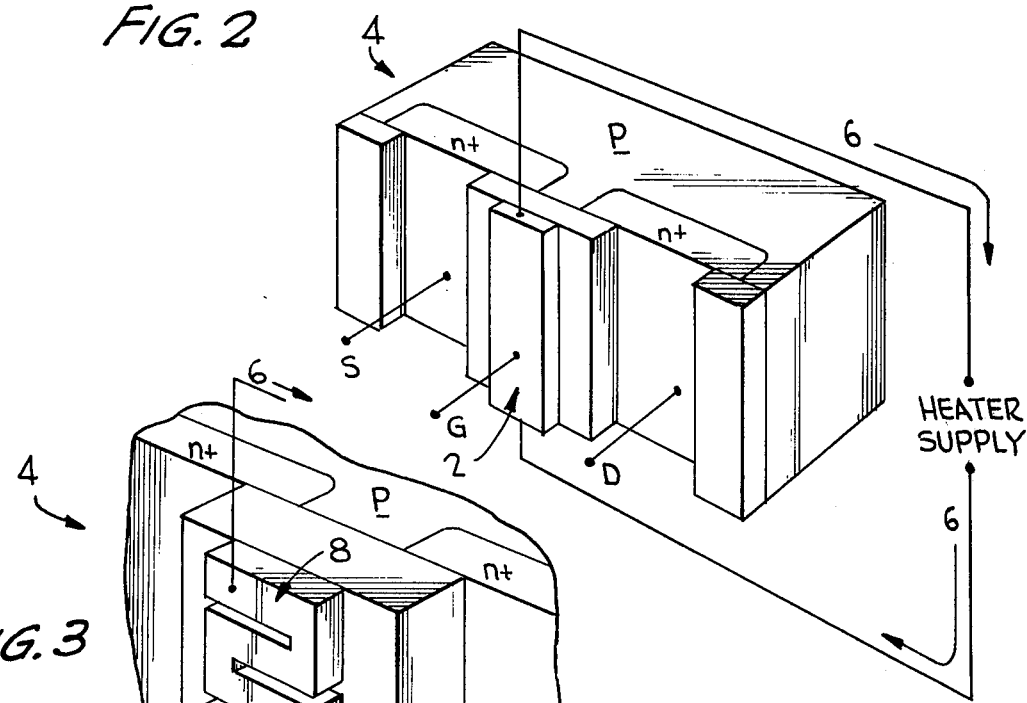
FIG. 2 illustrates schematically one of the possible embodiments for this invention for the case in which the metal hydride has a lower work function value than the pure metal and the process of absorption of hydrogen in the metal is exothermic.
Figure 3:
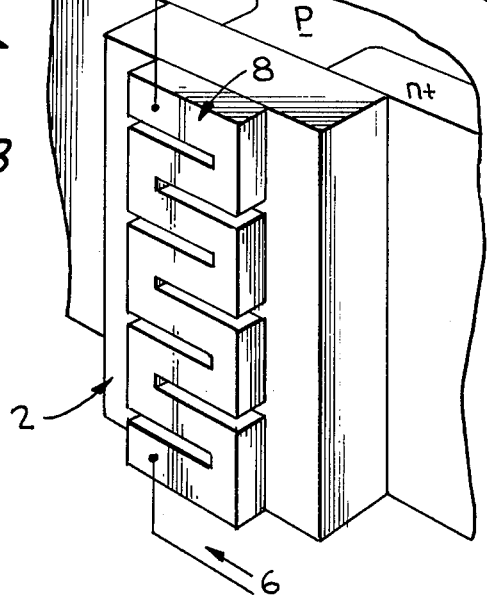
FIG. 3 illustrates a second technique for accomplishing the same result as in FIG. 2.

The change in the threshold voltage, $V_T$, due to an increase in trapped oxide charge, $\sigma$, is illustrated by the dot-dash curve in FIG. 1. Also shown by the dashed curve is the effect of an increasing metal gate electrode work function on the threshold voltage. The solid curve indicates the sum of both of these effects. In other words, if one can adjust the increase in $\phi$ in such a manner as to counteract the decrease in $-\sigma$, then the threshold voltage will remain constant. It was found that $\phi$ can be so varied by changing the gate electrode from being a metal to a metal hydride or conversely from being a metal hydride to a metal depending on whether the work function of the metal or metal hydride is larger. In the case where the work function of the metal is larger than the metal hydride the energy of absorption can be either exothermic or endothermic. When it is exothermic and the threshold voltage has shifted due to an accumulation of charge, the electrode material is heated to drive off some of the hydrogen and leave a hydrogen deficient metal hydride electrode. Several embodiments illustrating possible techniques for accomplishing this are shown in FIG. 2 and 3. Here the gate electrode 2 of field effect device 4 must be activated by a suitable switch described below that turns a heater current 6. The heat can be produced either directly in the gate electrode as in FIG. 2 or by applying a heating element 8 in the gate electrode. When the threshold voltage changes due to an increase in trapped charge, $\sigma$, near the interface, a current is caused to flow through the gate electrode causing the gate to heat up. Since its energy of absorption is exothermic gas will escape, and the metal hydride, now having less hydrogen, will have a larger valued metal-oxide work function, balancing the effect due to the trapped charges at the interface.

Figure 4:
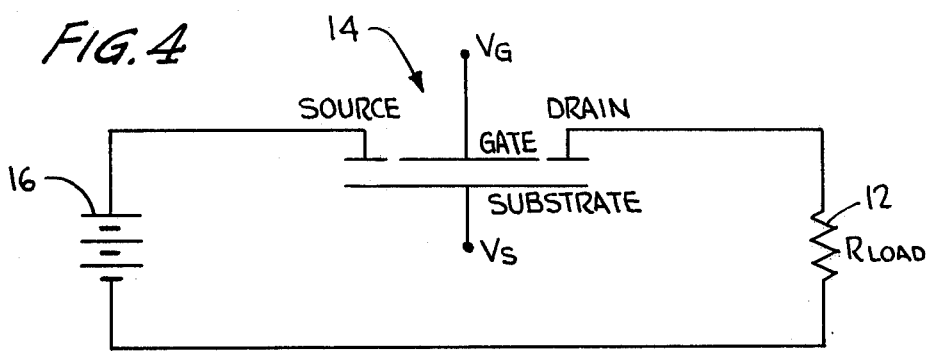
FIG. 4 illustrates schematically a suitable switching device for activating the control circuitry of this device.

A suitable switch can be an N-channel MOSFET with a metal hydride gate electrode connected in a manner illustrated in FIG. 4. The load resistor 12 is representative of all the gate electrode heaters of all the FETs, including that of the control N-channel MOSFET 14. All gate electrodes exhibit the exothermic, metal hydride properties discussed above.

During normal operation the voltage difference between the gate and substrate electrode, $V_G-V_S$, is less than the threshold voltage $V_T$ for switching on the control MOSFET and $R_{Load}$. If, however, positive charge is caused to be trapped at the oxide-semiconductor interface of all FET's including the control MOSFET, $V_T$ will become less negative, and the control MOSFET will turn on causing current to flow from source to drain and into $R_{Load}$, heating all the gate electrodes. Hydrogen will escape from all the gate electrodes, and $\phi$ will increase. When this occurs the control MOSFET will shut off at $V_G-V_S=V_T$. An additional increase in $\sigma$ will cause the control MOSFET to turn on, increase $\phi$, and again shut off at $V_G-V_S=V_T$. Hence, this feedback process continually stabilizes $V_T$ about its initial value by causing the necessary amount of hydrogen to escape from the gate electrodes.

Figure 5:
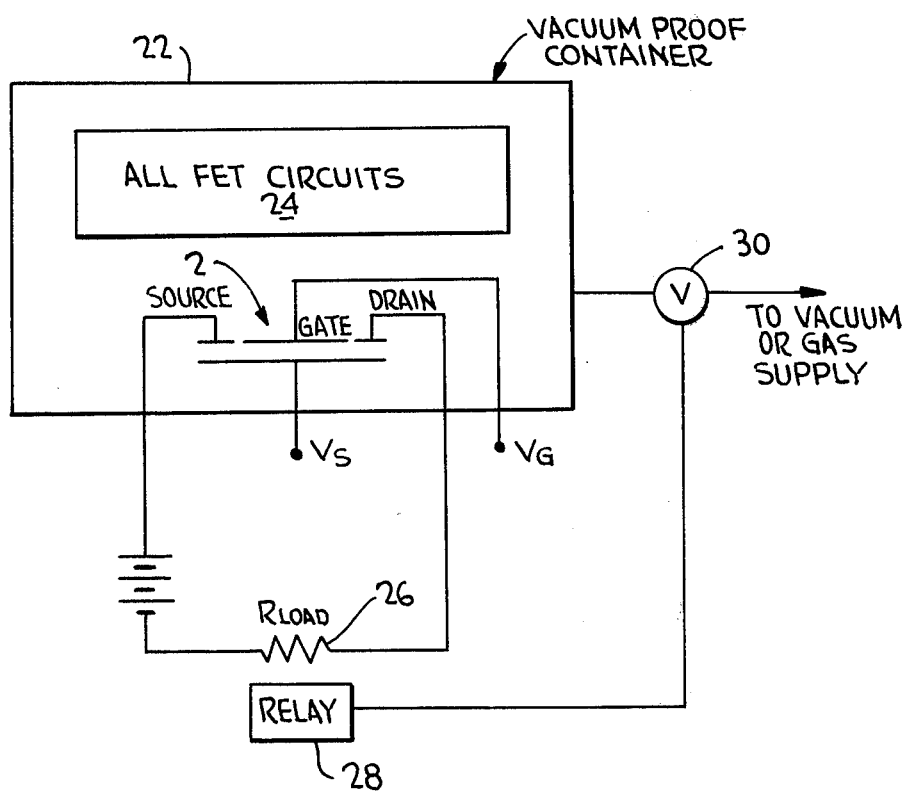
FIG. 5 illustrates schematically another of the possible embodiments for this invention for the case in which the metal hydride electrode has a lower work function than the metal and the process of absorption of hydrogen in the metal is endothermic or for the situation in which the metal hydride electrode has a higher work function than the metal.

If the energy of absorption of the metal hydride is endothermic the control MOSFET and all other FETs must be surrounded by a leak-proof container 22 as illustrated in FIG. 5. The container has a partial pressure of hydrogen in it such that the metal hydride gate electrodes are in thermodynamic equilibrium with the ambient hydrogen gas. The circuitry in this case is very similar to that of the exothermic case except that $R_{Load}$ is a relay 28 that operates a valve 30 that opens the container. Now when positive charge is caused to be trapped at the oxide-semiconductor interface, as in the above case, the control MOSFET will turn on causing current to flow into $R_{Load}$, actuating the relay and opening a valve such that the hydrogen gas bleeds from the container. Since the partial pressure of hydrogen has decreased, hydrogen will escape from the metal hydride gate eletrode, and the metal work function will increase, thus increasing $V_T$ to its prior valve. In the event that more charge, $\sigma$, is trapped at the interface, this feedback process will again stabilize $V_T$ about its initial value.

When the work function of the metal hydride is greater then the metal, all the gate electrodes 24 (FIG. 5) including that of the N-channel control MOSFET 2 are made of unhydrated metal and are placed in a vacuum chamber 22. If the energy of absorption is endothermic, during normal operation conrol MOSFET 2 is off. When $\sigma$ is increased the control MOSFET conducts causing current to flow through $R_{Load}$ 26. This turns on relay 28 which in turn actuates a valve 30 which introduces hydrogen through a supply into the vaccum chamber 22 surrounding all FETs 24. The hydrogen is thence absorbed into the metal gate electrodes hydrating them and at the same time increasing $\phi$ and stabilizing $V_T$ to its initial value.

If the energy of absorption is exothermic the technique is identical to that above except a constant partial pressure of hydrogen must be maintained after the valve is activated in order to keep the hydrogen in the gate electrode.

Therefore, it has been discovered that hydrogen can be absorbed or desorbed into the gate electrodes of field effect devices to keep the threshold voltage fixed when it is being subjected to hostile influences. The materials that can be used for the electrode material are not necessarily limited to those of the transition metals or rare earths, but to any combination which adequately serves the above mentioned duties. It is understood that this invention is not limited to the exact details of construction as shown and described for obvious modifications of parameters such as sensing controls and materials, as well as the suggested manner of use of this technique, maybe made therein without departing from the spirit of the invention.

What I claim as my invention is:

1. A solid state device which remains resistant to degradation generally caused by exposure to a hostile radiation environment which comprises:
    a field-effect device whose gate electrodes comprise materials whose work function can be changed; and
    means for changing the amount of hydrogen interstitially present in the materials such that the work function of the electrode gate is varied upon a sensed change in the semiconductor's threshold voltage, whereby the degrading effects on the semiconductors threshold voltage are cancelled.

2. The solid state device as set forth in claim 1 wherein the means for changing the amount of hydrogen present in the gate electrode comprises a heater circuit whereby desorption of hydrogen takes place in said materials.

3. The solid state device as set forth in claim 2 wherein the materials are hydrides of palladium.

4. The solid state device as set forth in claim 2 wherein the means for changing the amount of hydrogen present also comprises a switching means for turning on the heater circuit upon a sensed change in the semiconductors threshold voltage.

5. The solid state device as set forth in claim 1 wherein the means for changing the amount of hydrogen comprises:
   a container containing pressurized hydrogen which encloses the field-effect device having an outlet which permits hydrogen gas to leave the container; and
   an activating means for venting the hydrogen from the envelop upon a sensed change in the semiconductor's threshold voltage, whereby hydrogen is exothermally driven out of the gate electrode material.

6. The solid state device as set forth in claim 5 wherein the activating means comprises:
   a valve for venting the hydrogen from the container;
   a relay for operating the valve; and
   a switching means for turning on the relay upon a sensed change in the semiconductors threshold voltage.

7. The device set forth in claim 1 wherein the means for changing the amount of hydrogen comprises:
   a container which surrounds the semiconductor device having an inlet which permits hydrogen gas to enter the container;
   an activating means which upon the sensed change in the semiconductor's threshold voltage permits the entry of hydrogen gas from a hydrogen source into the exhausted chamber.

8. The device as set forth in claim 7 wherein the activation means comprises:
   a valve for controlling the amount of hydrogen gas entering the container;
   a relay for operating the valve; and
   a switching means for turning on the relay upon a sensed change in the semiconductor's threshold voltage.

9. The solid state device as set forth in claim 8 wherein the material chosen for the gate electrodes exothermally absorbs hydrogen and the container and valve are designed so as to maintain a constant partial pressure of hydrogen within the container.

10. The solid state device as set forth in claim 1 wherein the means for changing the amount of hydrogen present in the materials comprises a switching circuit which has an N-channel MOSFET acting as a control device.

* * * * *